(12) United States Patent
Hung et al.

(10) Patent No.: US 12,096,582 B2
(45) Date of Patent: Sep. 17, 2024

(54) BEARING STRUCTURE FOR HIGH-LOW-VOLTAGE CONVERSION CIRCUIT

(71) Applicant: Delta Electronics, Inc., Taoyuan (TW)

(72) Inventors: Jui-Chien Hung, Taoyuan (TW); Wen-Lung Huang, Taoyuan (TW); Chun-Han Lin, Taoyuan (TW); Sheng-Hua Li, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 264 days.

(21) Appl. No.: 17/875,130

(22) Filed: Jul. 27, 2022

(65) Prior Publication Data

US 2023/0371194 A1 Nov. 16, 2023

(30) Foreign Application Priority Data

May 11, 2022 (CN) .......................... 202210509627.4

(51) Int. Cl.
*H05K 7/06* (2006.01)
*H05K 7/18* (2006.01)

(52) U.S. Cl.
CPC .................. *H05K 7/06* (2013.01); *H05K 7/18* (2013.01)

(58) Field of Classification Search
None
See application file for complete search history.

(56) References Cited

U.S. PATENT DOCUMENTS

| 4,752,861 A | * | 6/1988 | Niggl | ...................... H05K 7/18 |
| | | | | 361/732 |
| 6,320,762 B1 | * | 11/2001 | Chen | .................... H05K 9/0026 |
| | | | | 174/521 |
| 2002/0137391 A1 | * | 9/2002 | Berberich | ............ H05K 9/0018 |
| | | | | 439/620.22 |
| 2004/0051620 A1 | * | 3/2004 | Tung | ................... H01F 17/0006 |
| | | | | 336/200 |
| 2008/0108478 A1 | * | 5/2008 | Wetzel | ............... F16H 61/0006 |
| | | | | 477/36 |
| 2011/0211284 A1 | * | 9/2011 | Yoneda | .................. H01H 83/20 |
| | | | | 29/622 |

(Continued)

FOREIGN PATENT DOCUMENTS

| CN | 114465445 A | 5/2022 |
| WO | 2014192817 A1 | 12/2014 |

*Primary Examiner* — Krystal Robinson
(74) *Attorney, Agent, or Firm* — KIRTON McCONKIE; Evan R. Witt

(57) ABSTRACT

A bearing structure for a high-low-voltage conversion circuit is disclosed and includes an insulation carrier, a first conductor layer, a second conductor layer, a first trench and a first insulation material. The first conductor layer and the second conductor layer are coated on the first surface and the second surface of the insulation carrier, respectively. A voltage difference is formed between the first conductor layer and the second conductor layer. The first trench is disposed on the first surface and surrounds an outer peripheral edge of the first conductor layer. The first conductor layer is extended from the first surface into the first trench, and the outer peripheral edge of the first conductor layer is located at a bottom of the first trench. The first insulation material covers the outer peripheral edge of the first conductor layer and is filled in the first trench.

21 Claims, 9 Drawing Sheets

(56) References Cited

U.S. PATENT DOCUMENTS

2018/0153046 A1   5/2018  Xie et al.
2019/0207529 A1   7/2019  Jacobson et al.
2022/0132687 A1*  4/2022  Liu ..................... H05K 5/0217
2023/0345658 A1* 10/2023  Azuma ................... H05K 7/06

* cited by examiner

BEARING STRUCTURE FOR HIGH-LOW-VOLTAGE CONVERSION CIRCUIT

FIELD OF THE INVENTION

The present disclosure relates to a bearing structure, and more particularly to a bearing structure for a high-low-voltage conversion circuit, so as to avoid the corona and partial discharge due to a high electric field strength on the outer peripheral edge of the conductor.

BACKGROUND OF THE INVENTION

With the development of the economy, the demand for electricity has increased sharply. Moreover, the safety requirements for electricity consumption are also getting higher and higher. Taking a common application of medium-voltage solid-state transformers as an example, a plurality of power conversion modules are disposed in a single system cabinet. Each power conversion module needs to be carried on an isolation carrier and be integrated into the system cabinet. Since a high-low voltage conversion circuit is contained in this kind of power conversion module, when the high-voltage circuit and the low-voltage circuit of the high-low conversion circuit are isolated through the isolation carrier, the isolation carrier is further spatially corresponding to a high electric field strength formed due to the voltage difference. Therefore, in order to carry under the action of high electric field strength, the isolation carrier has to avoid the repeated breakdown and extinction phenomenon of partial discharge caused by the structural defects.

In the conventional power conversion module of the solid-state transformer, the high-voltage circuit and the low-voltage circuit are disposed and corresponding to the conductor layer with a uniform electric field, respectively. However, under the action of high electric field strength, the phenomenon of the corona and partial discharge is generated easily on the outer peripheral edge of the conductor layer.

Therefore, there is a need of providing a bearing structure configured to carry a high-low-voltage conversion circuit with high electric field strength, wherein the outer peripheral edge of the conductor layer is sealed through the design of the trench, so as to solve the problem of excessive electric field strength generated due to the outer peripheral edge of the conductor layer on the insulation carrier, avoid the occurrence of corona and partial discharge, and obviate the drawbacks encountered by the prior arts.

SUMMARY OF THE INVENTION

An object of the present disclosure is to provide a bearing structure configured to carry a high-low-voltage conversion circuit with high electric field strength. By sealing the outer edge of the conductor layer through the design of the trench, the problem of excessive electric field strength generated due to the outer peripheral edge of the conductor layer on the insulation carrier is solved. Moreover, the occurrence of corona and partial discharge is avoided.

Another object of the present disclosure is to provide a bearing structure configured to carry and isolate a high-voltage circuit and a low-voltage circuit. The bearing structure is made of an insulation material with a dielectric strength greater than 18 kV/mm. When a high-voltage circuit and a low-voltage circuit with a voltage difference ranged from 10 kV to 30 kV are isolated through the bearing structure, the outer peripheral edge of the conductor layer is sealed by the trench and the insulation material. A distance is maintained between the outer peripheral edge of the conductor layer and an outer surface of the insulation material and greater than 0.6 mm. An air electric field strength on the outer surface of the insulation material is reduced and less than 2.0 kV/mm. It avoids the occurrence of corona and partial discharge due to the contact of the air and the outer peripheral edge of the conductor layer under the high electric field strength. In addition, when the trench and the insulation material are disposed on a peripheral wall formed by the protruding portion, it allows the bearing structure to form an upper half shell or a lower half shell. For example, two bearing structures are utilized to form two symmetrical half shells and assembled as a bearing housing. The high-voltage circuit is sandwiched between the two symmetrical half shells, and the low-voltage circuit is placed outside the bearing housing, so as to achieve a unit assembly of the power conversion module with small volume. It facilitates to ensure the safety of the solid-state transformer application and enhance the competitiveness of the product.

A further object of the present disclosure is to provide a bearing structure configured to carry a power conversion module with high electric field strength. The bearing structure having the outer peripheral edge of the conductor layer sealed through the designed trench is allowed to be applied to the bearing housing, which are detached into two symmetrical half shells. The insulation material is filled into the trench by fluid dispensing, which is easily integrated into the manufacturing process of the two symmetrical half shells carrying the power conversion module. The entire space is not increased. Thus, the safety specifications and the convenience of the bearing housing for the power conversion module are improved effectively.

In accordance with an aspect of the present disclosure, a bearing structure is provided and configured to carry a high-low-voltage conversion circuit. The bearing structure includes an insulation carrier, a first conductor layer, a second conductor layer a first trench and a first insulation material. The insulation carrier includes a first surface and a second surface opposite to each other. The first conductor layer and a second conductor layer are coated on the first surface and the second surface, respectively. A voltage difference is formed between the first conductor layer and the second conductor layer. The first trench is disposed on the first surface and surrounds an outer peripheral edge of the first conductor layer. The first conductor layer is extended from the first surface into the first trench, and the outer peripheral edge of the first conductor layer is located at a bottom of the first trench. The first insulation material covers the outer peripheral edge of the first conductor layer and is filled in the first trench.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
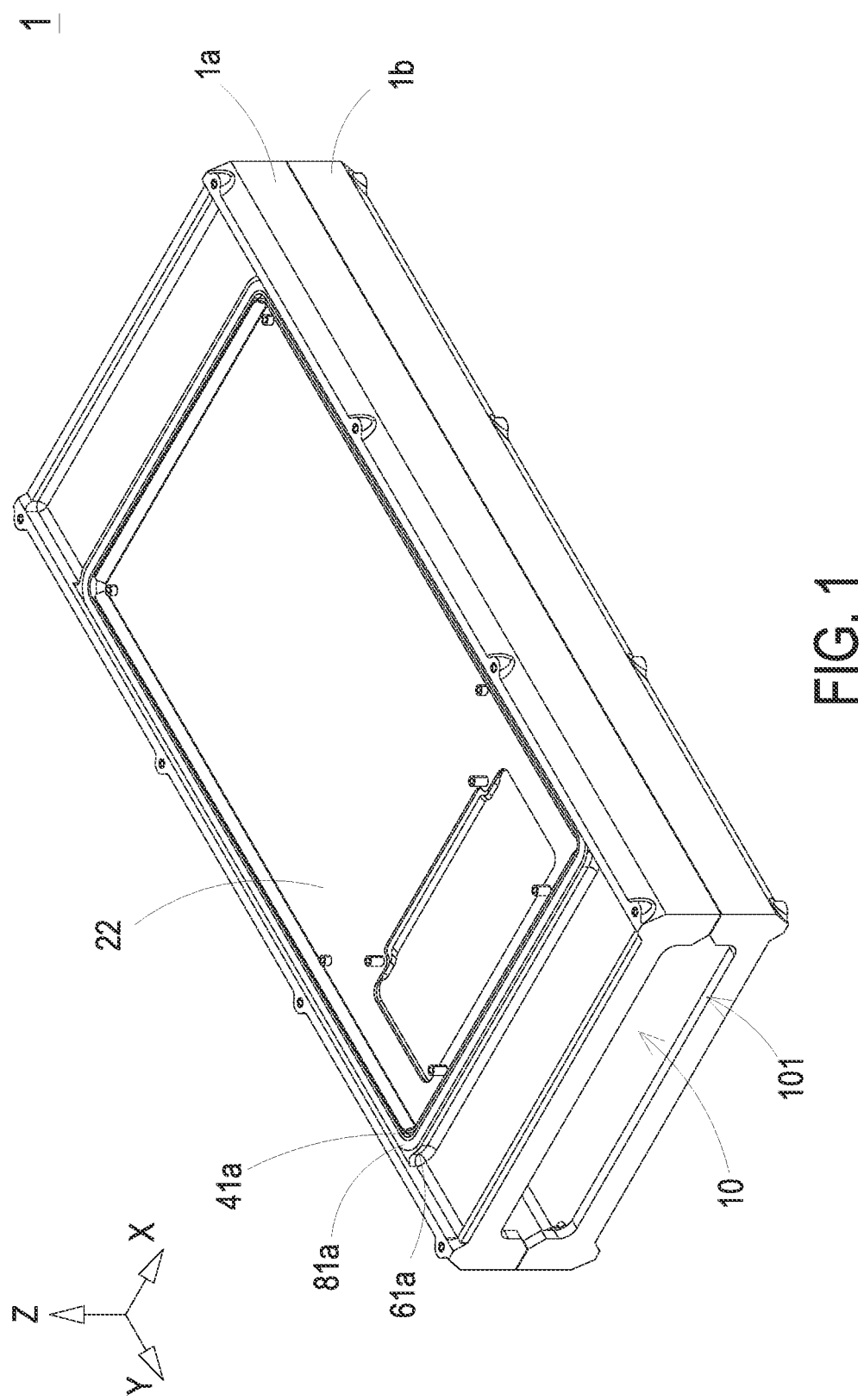
FIG. 1 is a perspective view illustrating a bearing structure utilized to form a bearing housing according to an embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "upper," "lower," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
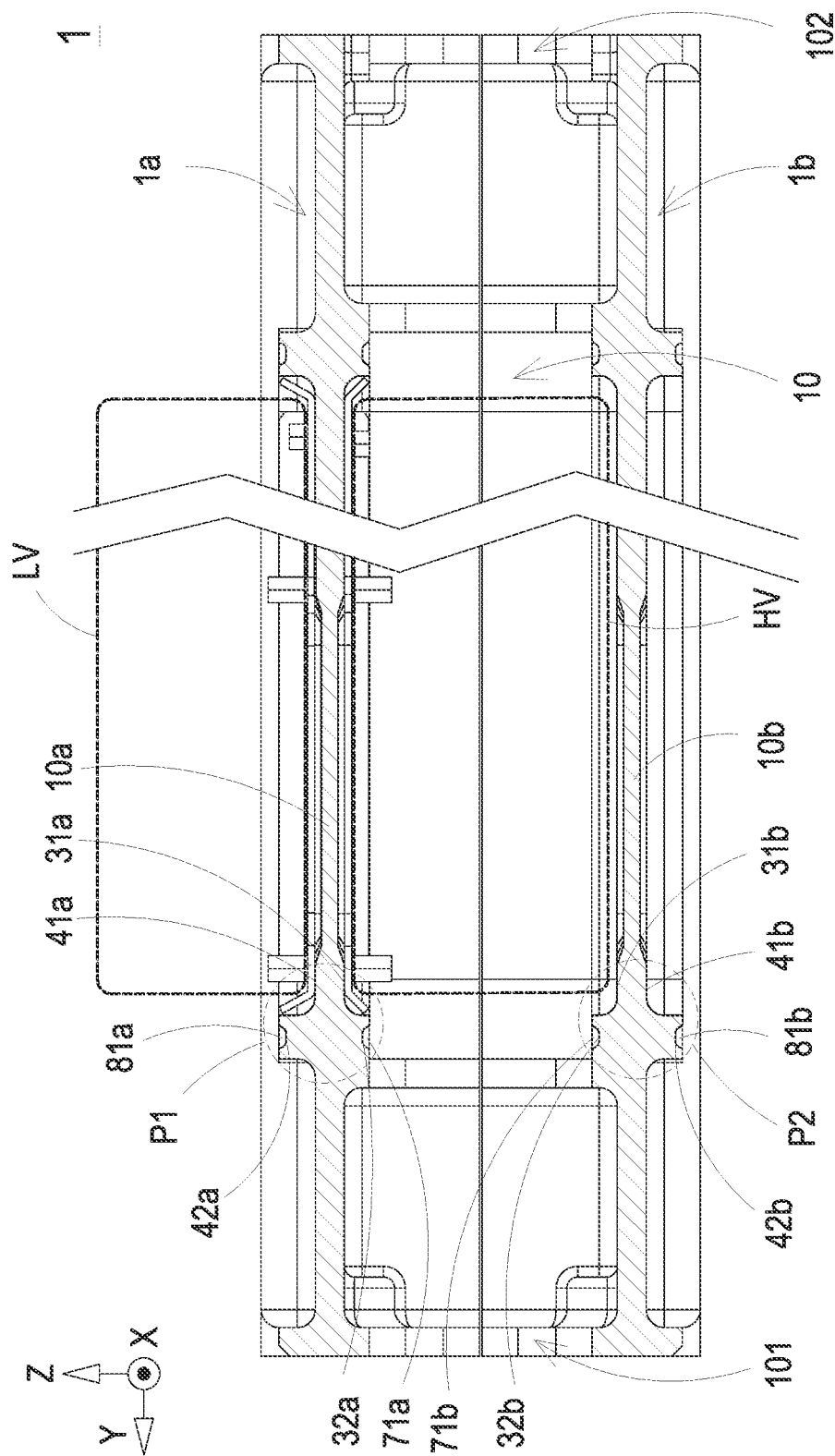
FIG. 2 is a cross-section view illustrating the bearing structure utilized to form the bearing housing and configured to carry a high-low-voltage conversion circuit according to the embodiment of the present disclosure.
Figure 3:
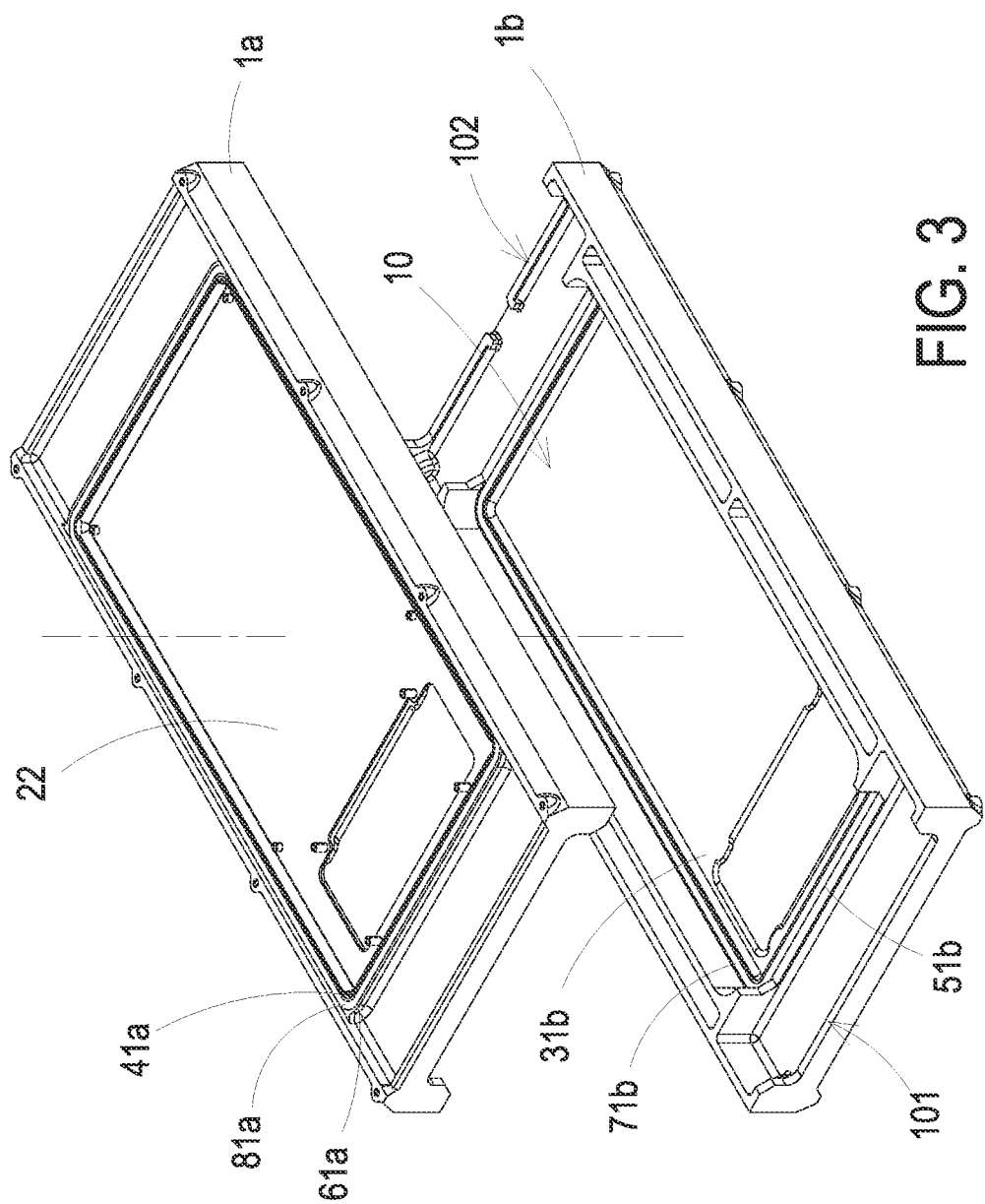
FIG. 3 is a perspective view illustrating the bearing structure utilized to form the bearing housing with the upper half shell and the lower half shell disassembled according to the embodiment of the present disclosure.

FIG. 1 is a perspective view illustrating a bearing structure utilized to form a bearing housing according to an embodiment of the present disclosure. FIG. 2 is a cross-section view illustrating the bearing structure utilized to form the bearing housing and configured to carry a high-low-voltage conversion circuit according to the embodiment of the present disclosure. FIG. 3 is a perspective view illustrating the bearing structure utilized to form the bearing housing with the upper half shell and the lower half shell disassembled according to the embodiment of the present disclosure. In the embodiment, a bearing structure 1a or a bearing structure 1b is configured to carry a high-low-voltage conversion circuit. Preferably but not exclusively, the bearing housing 1 formed by the bearing structure 1a and the bearing structure 1b is applied in the field of the solid state transformer (SST), so as to simplify the carrying and assembling procedures of the power conversion module in the solid state transformer. At the same time, it ensures that each unit of the power conversion module meets the safety specifications and avoids the phenomenon of corona and partial discharge caused by the high electric field strength. Certainly, the present disclosure is not limited thereto. Preferably but not exclusively, in the embodiment, the bearing structure 1a is an upper half shell, the bearing structure 1b is a lower half shell, and the upper half shell and the lower half shell are symmetrical and assembled with each other to form a bearing housing 1 having an accommodation space 10. In an embodiment, the bearing housing 1 includes a front opening 101 and a rear opening 102. The front opening 101 and the rear opening 102 are in fluid communication with each other through the accommodation space 10, so as to facilitates the bearing housing 1 to accommodate a high-voltage circuit HV and provide the functions of ventilation and heat dissipation. Certainly, the present disclosure is not limited thereto. Notably, in case of that the bearing housing 1 is utilized to carry one unit of the high-low-voltage conversion circuit, the high-voltage circuit HV is sandwiched between the upper half shell of the bearing structure 1a and the lower half shell of the bearing structure 1b, and the low-voltage circuit LV is disposed on an outer side of the bearing housing 1. Preferably but not exclusively, the low-voltage circuit LV is disposed on the top of the upper half shell of the bearing structure 1a. Certainly, the present disclosure is not limited thereto. In other embodiments, a plurality of units of the power conversion modules are carried on a plurality of bearing housings 1, respectively, and then stacked with each other. In that, the high-voltage circuit HV accommodated with a bearing housing 1 and the low-voltage circuit LV disposed outside another bearing housing 1 have a voltage difference formed between the lower half shell of the bearing structure 1b. In other words, the bearing structure 1a and the bearing structure 1b of the present disclosure are not limited to be served as an upper half shell or a lower half shell, and described here firstly.

Figure 4A:
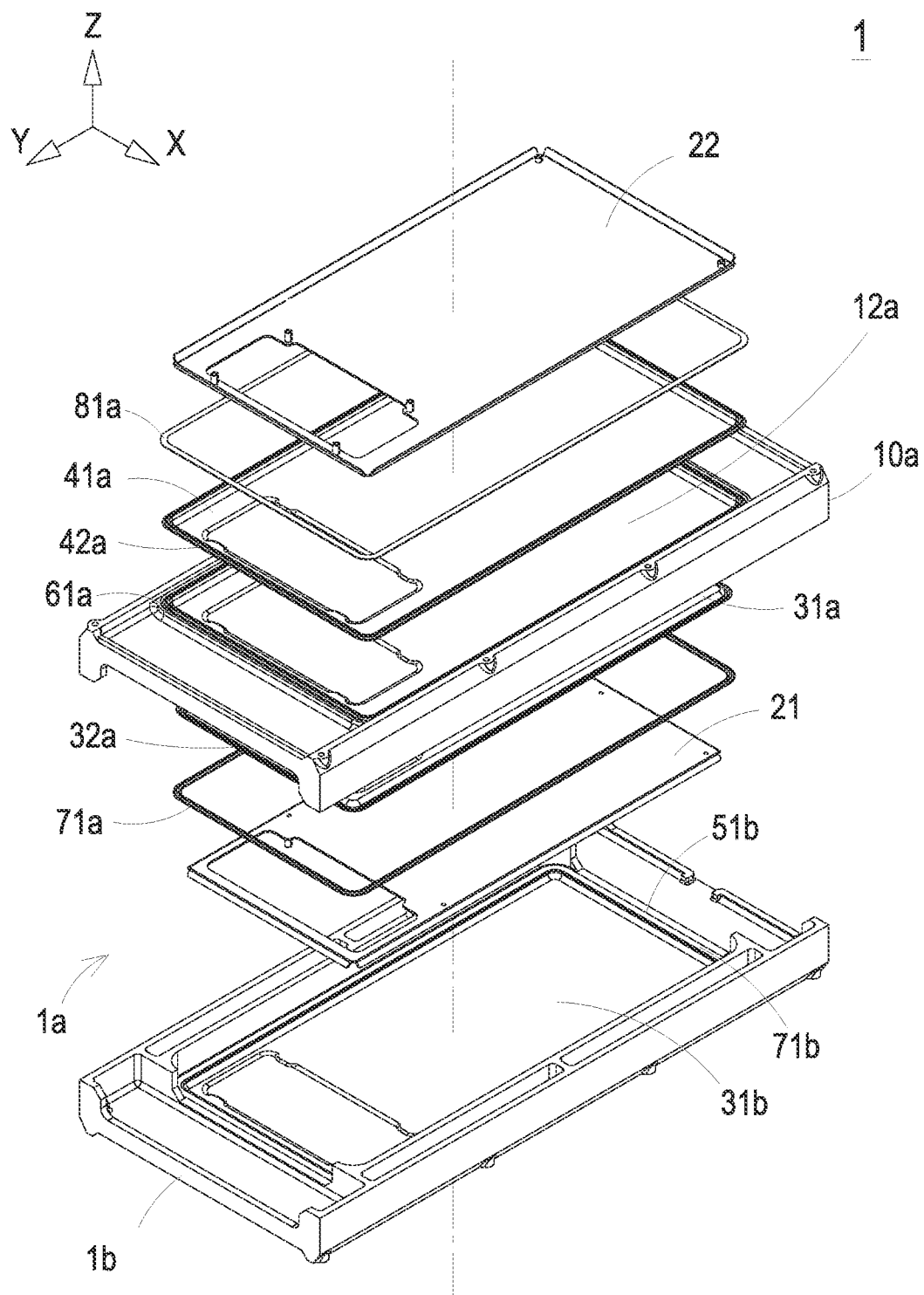
FIGS. 4A and 4B are partial exploded views illustrating the upper half shell of the bearing housing formed by the bearing structure according to the embodiment of the present disclosure.
Figure 4B:
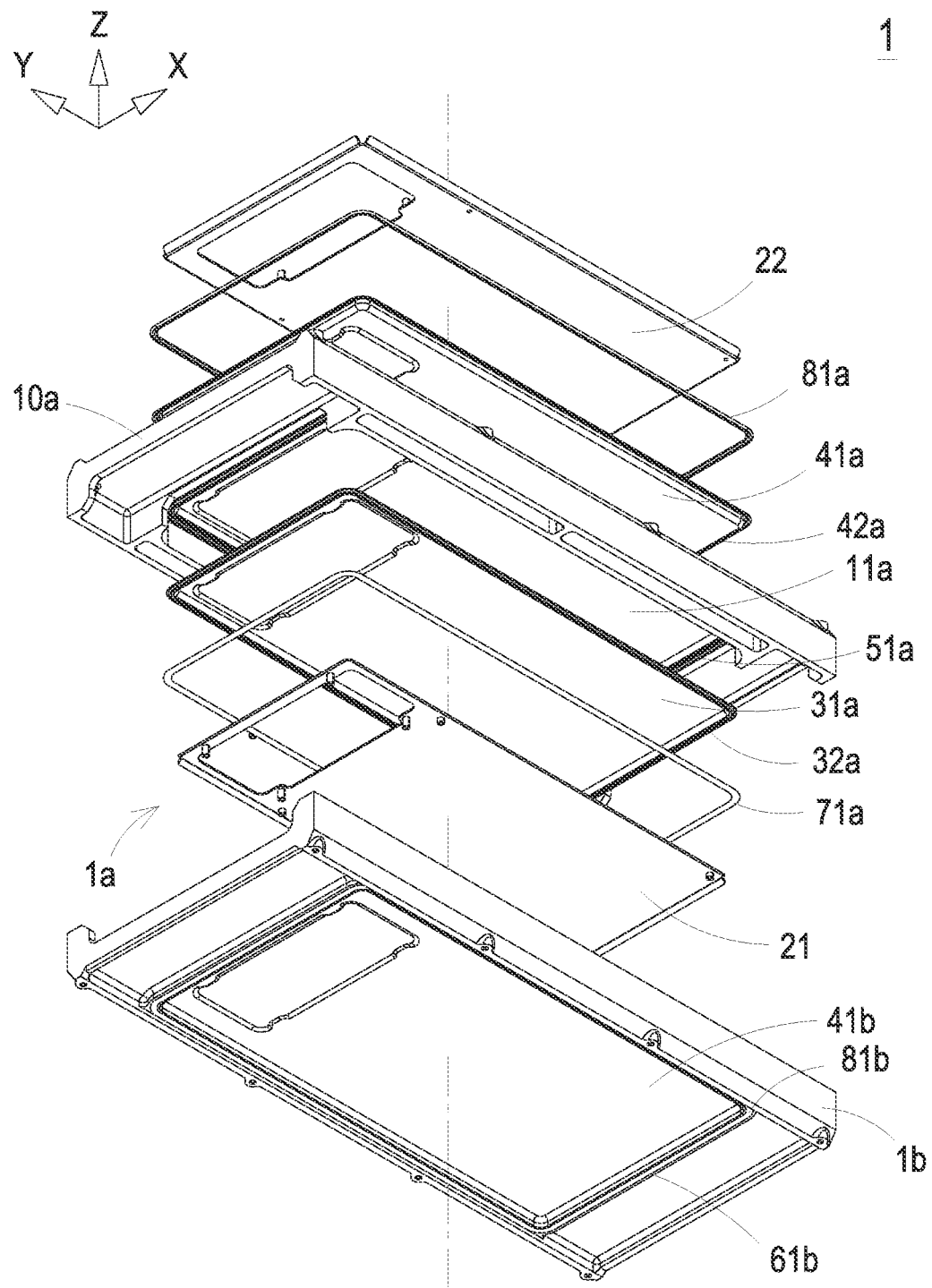
Figure 5:
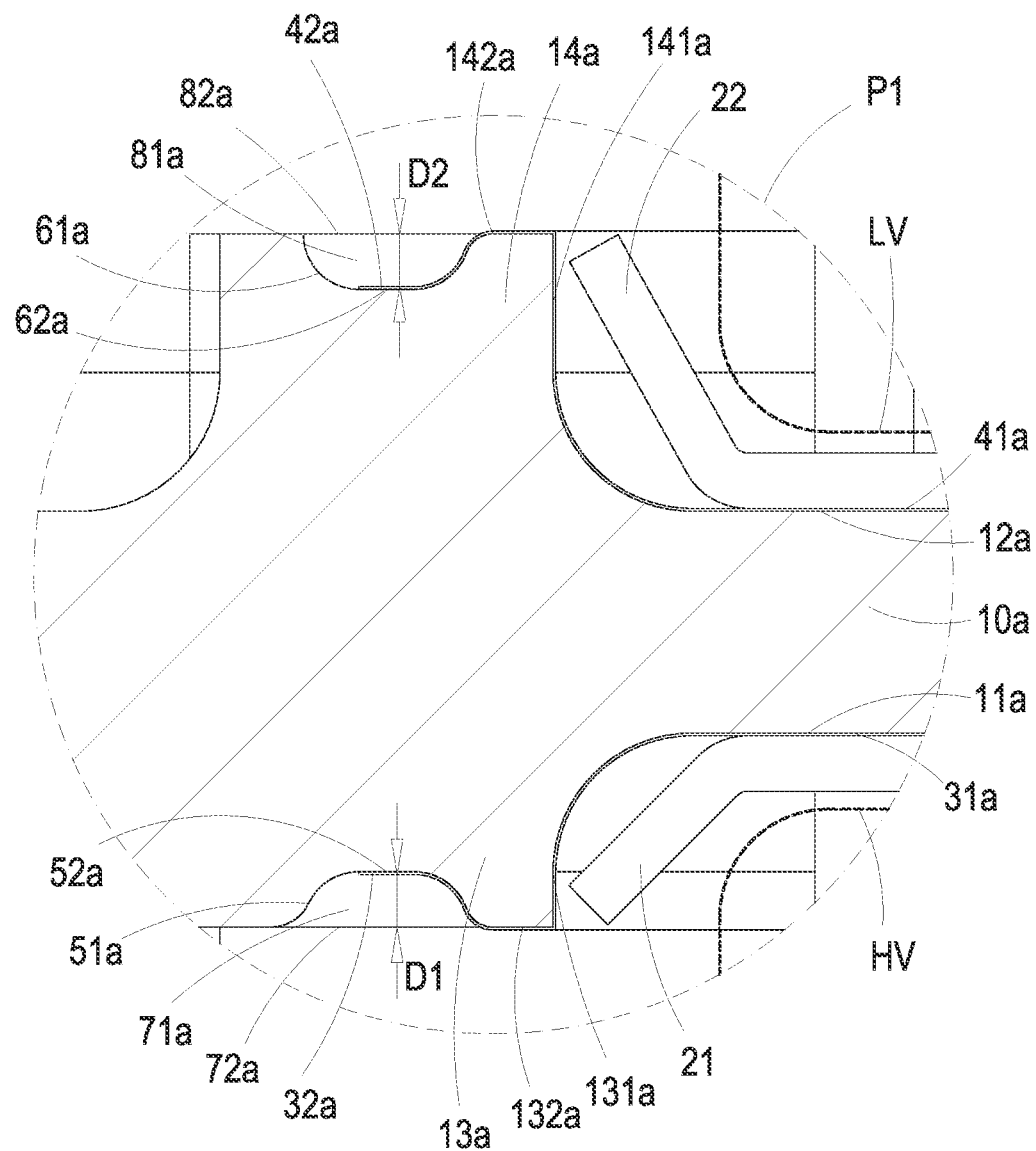
FIG. 5 is an enlarged view showing the region P1 in FIG. 2.

FIGS. 4A and 4B are partial exploded views illustrating the upper half shell of the bearing housing formed by the bearing structure according to the embodiment of the present disclosure. FIG. 5 is an enlarged view showing the region P1 in FIG. 2. In the embodiment, the bearing structure 1a is configured to form an upper half shell. The bearing structure 1a includes an insulation carrier 10a, a first conductor layer 31a, a second conductor layer 41a, a first trench 51a and a first insulation material 71a. The insulation carrier 10a includes a first surface 11a and a second surface 12a opposite to each other. Preferably but not exclusively, the first conductor layer 31a and the second conductor layer 41a are the zinc metal coating layers and coated on the first surface 11a and the second surface 12a, respectively. Moreover, a voltage difference is formed between the first conductor layer 31a and the second conductor layer 41a. Notably, in the embodiment, the high-voltage circuit HV is disposed on a first aluminum plate 21 over the first conductor layer 31a, and the first aluminum plate 21 is spatially corresponding to the first conductor layer 31a, so that the electric field generated by the high-voltage circuit HV is uniformized through the action of the first conductor layer 31a. Similarly, the low-voltage circuit LV is disposed on a second aluminum plate 22 over the second conductor layer 41a, and the second aluminum plate 22 is spatially corresponding to the second conductor layer 41a, so that the electric field generated by the low-voltage circuit LV is uniformized through the action of the second conductor layer 41a. In other words, the voltage difference of the high-voltage circuit HV and the low-voltage circuit LV is formed between the first conductor layer 31a and the second conductor layer 41a. Certainly, the types of the high-voltage circuit HV formed on the first surface 11a and the low-voltage circuit LV formed on the second surface 12a are not limited in the present disclosure. In the embodiment, the voltage difference formed between the high-voltage circuit HV and the low-voltage circuit LV is ranged from 10 kV to 30 kV, but the present disclosure is not limited there.

Notably, in the embodiment, the first trench 51a is disposed on the first surface 11a and surrounds an outer peripheral edge 32a of the first conductor layer 31a. Preferably but not exclusively, in the embodiment, the first conductor layer 31a is coated on the first surface 11a and extended into the first trench 51a, so that the outer peripheral edge 32a of the first conductor layer 31a is located at a bottom 52a of the first trench 51a. In the embodiment, the first insulation material 71a covers the outer peripheral edge 32a of the first conductor layer 31a and filled in the first trench 51a. In the embodiment, the voltage difference formed between the high-voltage circuit HV and the low-voltage circuit LV is ranged from 10 kV to 30 kV. The first insulation material 71a is one selected from the group consisting of an epoxy resin, a silicone rubber, a silicone resin and a polyurethane. Moreover, the first insulation material 71a has a dielectric strength greater than 18 kV/mm. Preferably but not exclusively, in the embodiment, the first insulation material 71a is filled into the first trench 51a by fluid dispensing, so that an outer surface 72a of the first insulation material 71a is coplanar with the opening of the first trench 51a. Thereby, the outer peripheral edge 32a of the first conductor layer 31a is sealed through the first trench 51a and the first insulation material 71a, and a distance D1 is maintained between the outer peripheral edge 32a of the first conductor layer 31a and the outer surface 72a of the first insulation material 71a and greater than 0.6 mm.

According to the result of the partial discharge test, an air electric field strength on the outer surface 72a of the first insulation material 71a is less than 2.0 kV/mm. It avoids the occurrence of corona and partial discharge due to the contact of the air and the outer peripheral edge 32a of the first conductor layer 31a under the high electric field strength.

In the embodiment, the bearing structure 1a is constructed on the upper half shell of the supporting housing 1, and the bearing structure 1a further includes a first protruding portion 13a, which is protruded from the first surface 11a in a direction (i.e., the reverse Z axial direction) away the second surface 12a. The first trench 51a is disposed on the first protruding portion 13a. The first conductor layer 31a is coated and disposed on the first surface 11a and a lateral wall 131a and a top surface 132a of the first protruding portion 13a, and extended into the bottom 52a of the first trench 51a. Since the first trench 51a is disposed on the first protruding portion 13a, when the first insulation material 71a is filled into the first trench 51a by fluid dispensing, the lateral-wall structure of the first protruding portion 13a is helpful of performing the fluid dispensing, and preventing the fluid that is not solidified to form the first insulation material 71a from overflowing everywhere. Preferably but not exclusively, in an embodiment, the outer surface 72a of the first insulation material 71a and the top surface 132a of the first protruding portion 13a are coplanar. Certainly, the present disclosure is not limited thereto.

Moreover, in the embodiment, the bearing structure 1a further includes a second trench 61a and a second insulation material 81a. The second trench 61a is disposed on the second surface 12a and surrounds an outer peripheral edge 42a of the second conductor layer 41a. Preferably but not exclusively, in the embodiment, the second conductor layer 41a is coated on the second surface 12a and extended into the second trench 61a, so that the outer peripheral edge 42a of the second conductor layer 41a is located at a bottom 62a of the second trench 61a. In the embodiment, the second insulation material 81a is filled in the second trench 61a, and covers the outer peripheral edge 42a of the second conductor layer 41a. Similarly, the bearing structure 1a further includes a second protruding portion 14a, which is protruded from the second surface 12a in a direction (i.e. the Z axial direction) away the first surface 11a. The second trench 61a is disposed on the second protruding portion 14a. The second conductor layer 41a is coated and disposed on the second surface 12a and a lateral wall 141a and a top surface 142a of the second protruding portion 14a, and extended into the bottom 62a of the second trench 61a. Since the second trench 61a is disposed on the second protruding portion 14a, when the second insulation material 81a is filled into the second trench 61a by fluid dispensing, the lateral-wall structure of the second protruding portion 14a is helpful of performing the fluid dispensing, and preventing the fluid that is not solidified to form the second insulation material 81a from overflowing everywhere. Preferably but not exclusively, in an embodiment, the outer surface 82a of the second insulation material 81a and the top surface 142a of the second protruding portion 14a are coplanar. Preferably but not exclusively, in the embodiment, the voltage difference formed between the high-voltage circuit HV and the low-voltage circuit LV is ranged from 10 kV to 30 kV. The second insulation material 81a is one selected from the group consisting of an epoxy resin, a silicone rubber, a silicone resin and a polyurethane. Moreover, the second insulation material 81a has a dielectric strength greater than 18 kV/mm. Since the outer peripheral edge 42a of the second conductor layer 41a is sealed through the second trench 61a and the second insulation material 81a, and a distance D2 is maintained between the outer peripheral edge 42a of the second conductor layer 41a and the outer surface 82a of the second insulation material 81a and greater than 0.6 mm. According to the result of the partial discharge test, an air electric field strength on the outer surface 82a of the second insulation material 81a is less than 2.0 kV/mm. It avoids the occurrence of corona and partial discharge due to the contact of the air and the outer peripheral edge 42a of the second conductor layer 41a under the high electric field strength.

Notably, in the embodiment, the heights of the first protruding portion 13a and/or the second protruding portion 14a are adjustable according to the practical requirements. In other embodiments, the first protruding portion 13a and/or the second protruding portion 14a are omitted. In an embodiment, the first trench 51a is recessed directly from the first surface 11a toward the second surface 12a (i.e. in the Z axial direction). Moreover, the first conductor layer 31a is coated and disposed on the first surface 11a, and extended directly from the first surface 11a to the bottom 52a of the first trench 51a. In that, the first insulation material 71a covers the outer peripheral edge 32a of the first conductor layer 31a, and the outer peripheral edge 32a of the first conductor layer 31a is sealed. Preferably but not exclusively, in an embodiment, the outer surface 72a of the first insulation material 71a is substantially coplanar with the first surface 11a. In another embodiment, the second trench 61a is recessed directly from the second surface 12a toward the first surface 11a (i.e. in the reverse Z axial direction). Moreover, the second conductor layer 41a is coated and disposed on the second surface 12a, and extended directly from the second surface 12a to the bottom 62a of the second trench 61a. In that, the second insulation material 81a covers the outer peripheral edge 42a of the second conductor layer 41a, and the outer peripheral edge 42a of the second conductor layer 41a is sealed. Preferably but not exclusively, in an embodiment, the outer surface 82a of the second insulation material 81a is substantially coplanar with the second surface 12a. Certainly, the present disclosure is not limited thereto, and not redundantly described herein.

Figure 6A:
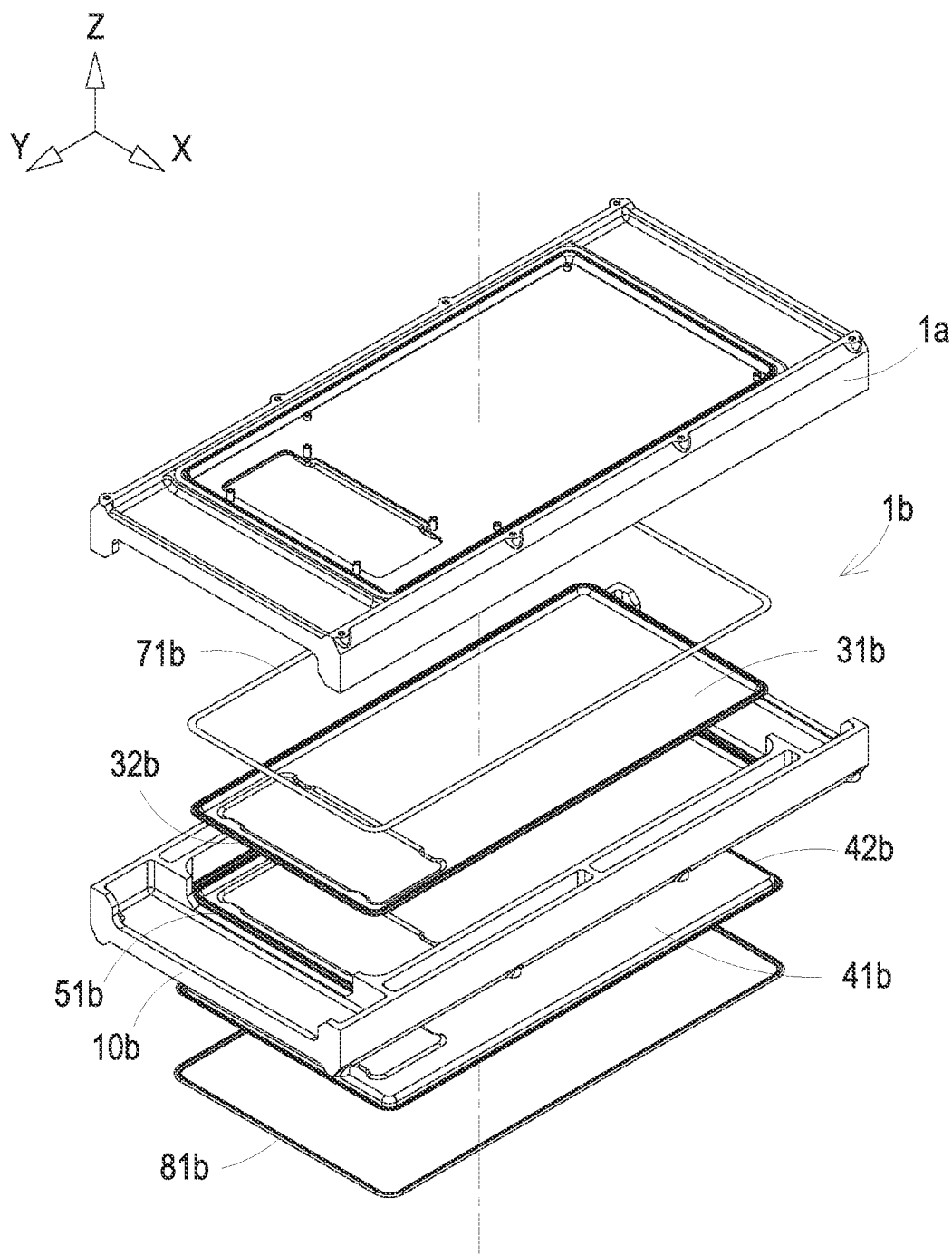
FIGS. 6A and 6B are partial exploded views illustrating the lower half shell of the bearing housing formed by the bearing structure according to the embodiment of the present disclosure.
Figure 6B:
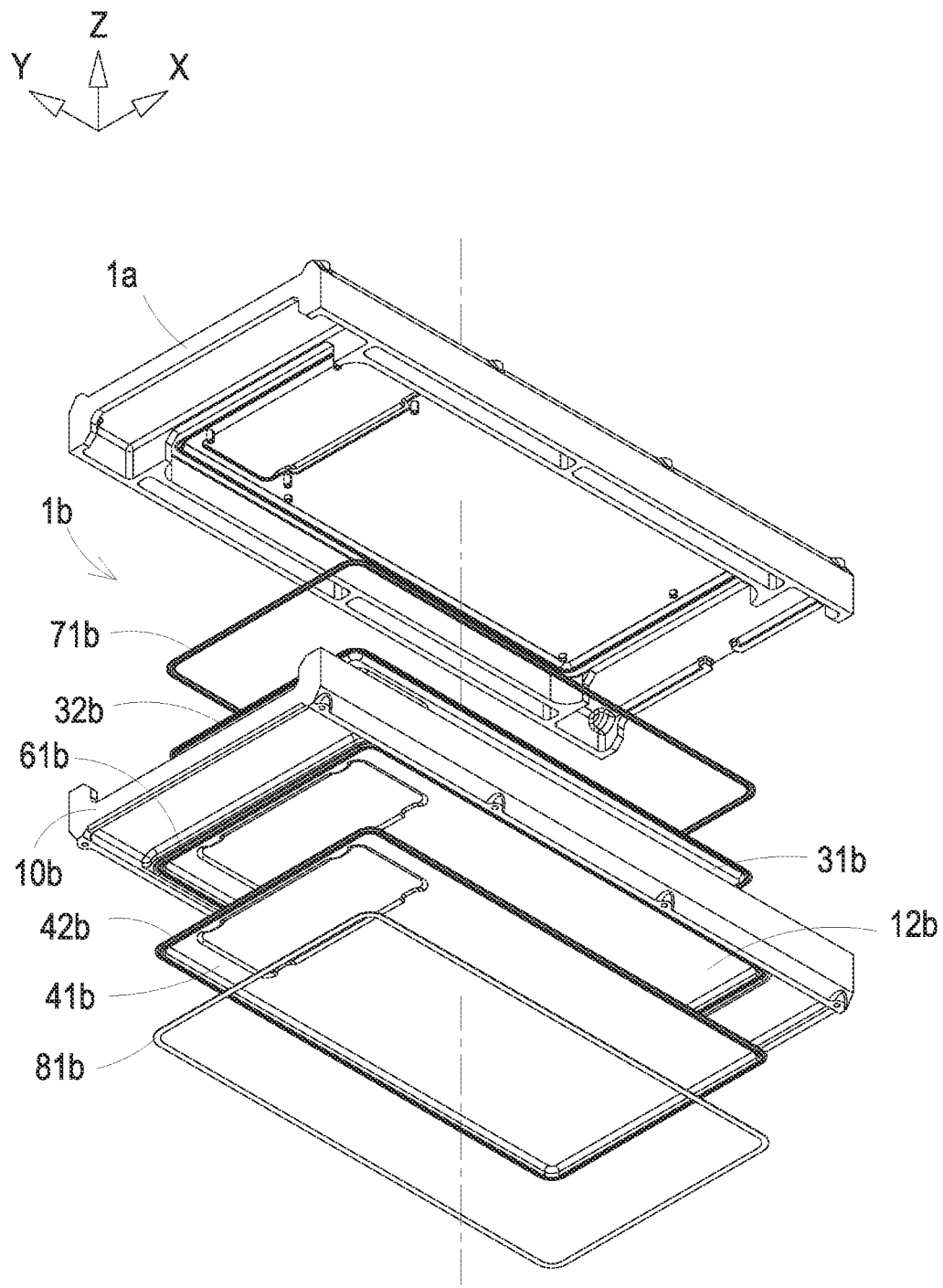
Figure 7:
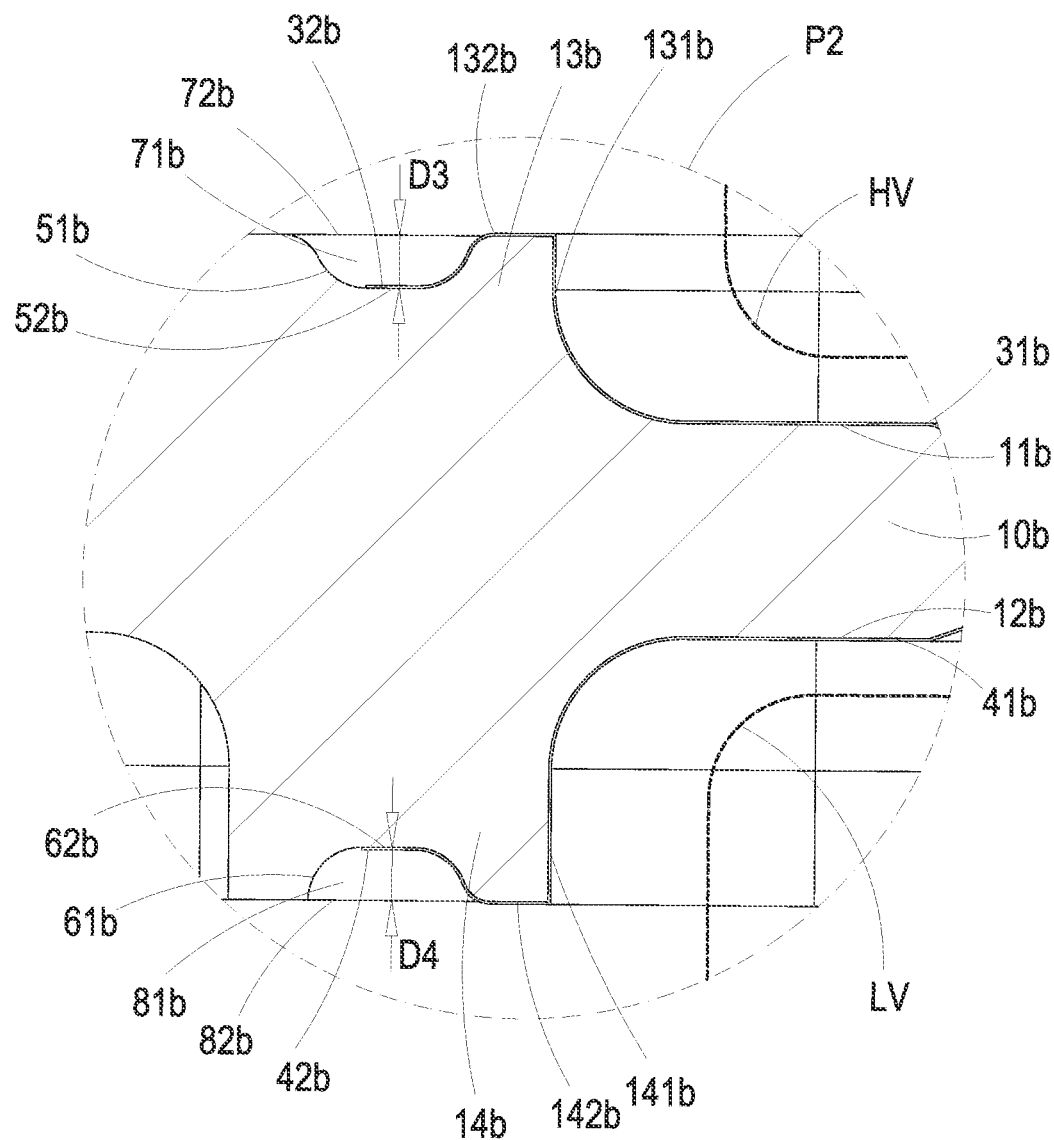
FIG. 7 is an enlarged view showing the region P2 in FIG. 2.

FIGS. 6A and 6B are partial exploded views illustrating the lower half shell of the bearing housing formed by the bearing structure according to the embodiment of the present disclosure. FIG. 7 is an enlarged view showing the region P2 in FIG. 2. In the embodiment, the bearing structure 1b is configured to form a lower half shell. The bearing structure 1b includes an insulation carrier 10b, a first conductor layer 31b, a second conductor layer 41b, a first trench 51b and a first insulation material 71b. The insulation carrier 10b includes a first surface 11b and a second surface 12b opposite to each other. Preferably but not exclusively, the first conductor layer 31b and the second conductor layer 41b are coated on the first surface 11b and the second surface 12b, respectively. Moreover, a voltage difference is formed between the first conductor layer 31b and the second conductor layer 41b. Notably, in the embodiment, the high-voltage circuit HV is accommodated within the bearing housing 1, and spatially corresponding to the first conductor layer 31b coated on the first surface 11b of the insulation carrier 10b, so that the electric field generated by the high-voltage circuit HV is uniformized through the action of the first conductor layer 31b. On the other hand, when the two bearing housings 1 with the power conversion modules carried thereon are stacked with each other, the second conductor layer 41b coated on the second surface 12b of the insulation carrier 10b of the upper bearing housing 1 is spatially opposite to the low-voltage circuit LV disposed on the outer side of the lower bearing housing. 1, so that the electric field generated by the low-voltage circuit LV outside the lower bearing housing 1 can be uniformized through the action of the second conductor layer 41b of the upper bearing housing 1. In other words, the voltage difference of the high-voltage circuit HV and the low-voltage circuit LV is formed between the first conductor layer 31b and the second conductor layer 41b.

In the embodiment, the bearing structure 1b includes a first protruding portion 13b, which is protruded from the first surface 11b in a direction (i.e., the Z axial direction) away the second surface 12b. The first trench 51b is disposed on the first protruding portion 13b. The first conductor layer 31b is coated and disposed on the first surface 11b and a lateral wall 131b and a top surface 132b of the first protruding portion 13b, and extended into the bottom 52b of the first trench 51b. In the embodiment, the first insulation material 71b covers the outer peripheral edge 32b of the first conductor layer 31b and filled in the first trench 51b. In the embodiment, the voltage difference formed between the high-voltage circuit HV and the low-voltage circuit LV is ranged from 10 kV to 30 kV. The first insulation material 71b is one selected from the group consisting of an epoxy resin, a silicone rubber, a silicone resin and a polyurethane. Moreover, the first insulation material 71b has a dielectric strength greater than 18 kV/mm. Preferably but not exclusively, in the embodiment, the first insulation material 71b is filled into the first trench 51b by fluid dispensing, so that an outer surface 72b of the first insulation material 71b is coplanar with the top surface 132b of the first protruding portion 13b. Thereby, the outer peripheral edge 32b of the first conductor layer 31b is sealed through the first trench 51b and the first insulation material 71b, and a distance D3 is maintained between the outer peripheral edge 32b of the first conductor layer 31b and the outer surface 72b of the first insulation material 71b and greater than 0.6 mm. According to the result of the partial discharge test, an air electric field strength on the outer surface 72b of the first insulation material 71b is less than 2.0 kV/mm. It avoids the occurrence of corona and partial discharge due to the contact of the air and the outer peripheral edge 32b of the first conductor layer 31b under the high electric field strength.

Similarly, in the embodiment, the bearing structure 1b includes a second protruding portion 14b, which is protruded from the second surface 12b in a direction (i.e. the reverse Z axial direction) away the first surface 11b. The second trench 61b is disposed on the second protruding portion 14b. The second conductor layer 41b is coated and disposed on the second surface 12b and a lateral wall 141b and a top surface 142b of the second protruding portion 14b, and extended into the bottom 62b of the second trench 61b. The second insulation material 81b is filled into the second trench 61b by fluid dispensing, and the outer surface 82b of the second insulation material 81b and the top surface 142b of the second protruding portion 14b are coplanar. Preferably but not exclusively, in the embodiment, the voltage difference formed between the high-voltage circuit HV and the low-voltage circuit LV is ranged from 10 kV to 30 kV. The second insulation material 81b is one selected from the group consisting of an epoxy resin, a silicone rubber, a silicone resin and a polyurethane. Moreover, the second insulation material 81b has a dielectric strength greater than 18 kV/mm. Since the outer peripheral edge 42b of the second conductor layer 41b is sealed through the second trench 61b and the second insulation material 81b, and a distance D4 is maintained between the outer peripheral edge 42b of the second conductor layer 41b and the outer surface 82b of the second insulation material 81b and greater than 0.6 mm. According to the result of the partial discharge test, an air electric field strength on the outer surface 82b of the second insulation material 81b is less than 2.0 kV/mm. It avoids the occurrence of corona and partial discharge due to the contact of the air and the outer peripheral edge 42b of the second conductor layer 41b under the high electric field strength.

In other embodiment, the bearing structures 1a and the bearing structure 1b of the present disclosure are utilized to carry other circuit modules with the high electric field strength generated therefrom. By sealing the outer edge of the conductor layer through the design of the trench, the problem of excessive electric field strength generated due to the outer peripheral edge of the conductor layer on the insulation carrier is solved, and the occurrence of corona and partial discharge is avoided. Certainly, the bearing structure 1a and bearing structure 1b designed to seal the outer peripheral edges of the conductor layers through the trenches are not limited to the two half shells of the bearing housing 1. However, in the case of that the bearing structure 1a and the bearing structure 1b are utilized to form the two symmetrical half shells of the bearing housing 1, the first insulation materials 71a, 71b and the second insulation materials 81a, 81b are filled into the corresponding first trenches 51a, 51b and the corresponding trenches 61a, 61b by fluid dispensing, respectively. It allows to integrate the formation processes into the manufacturing processes of the bearing housing 1 easily. Moreover, the assembly of the bearing hosing 1 and the power conversion module is not affected. In addition, the first insulation materials 71a, 71b and the second insulation materials 81a, 81b cooperated with the corresponding first trenches 51a, 51b and the corresponding second trenches 61a, 61b are disposed in the bearing housing 1, so that the entire space is not increased. It is not necessary to add an additional space. Thus, the safety specifications and the convenience of the bearing housing for the power conversion module are improved effectively. The bearing housing 1 formed by the bearing structure 1a and the bearing structure 1b is advantageous of sandwiching the high-voltage circuit HV in the accommodation space 10 therebetween simply. Furthermore, the low-voltage circuit LV is disposed on the outer side of the bearing housing 1. In that, a unit assembly of power conversion module with small volume is achieved. It facilitates to ensure the safety of the solid-state transformer application and enhance the competitiveness of the product. On the other hand, in case of that the bearing housing 1 formed by the bearing structure 1a and the bearing structure 1b is used to carry the high-low-voltage conversion circuit of the power conversion module in the solid state transformer, it allows to adjust the bearing structure 1a and the bearing structure 1b according to the isolation transformer included in the high-low-voltage conversion circuit. Referring to FIGS. 1 to 3 and taking the bearing structure 1a as an example, in an embodiment, a first recessed region (not shown) is formed on the first surface 11a covered by the first conductor layer 31a, a second recessed region (not shown) is formed on the second surface 12a covered by the second conductor layer 41a, and the first recessed region and the second recessed region are spatially corresponding to each other in position. In that, the isolation transformer of the high-low-voltage conversion circuit is disposed correspondingly in the first recessed region and the second recessed region. Similarly, the bearing structure 1b is a symmetrical structure of the bearing structure 1a, and has the same design. However, it is not an essential feature of the present disclosure, and the effects of sealing outer peripheral edges of the first conductor layers 31a, 31b or the second conductor layers 41a, 41b are not influenced. The present disclosure is not limited thereto and not redundantly described hereafter.

In summary, the present disclosure provides a bearing structure configured to carry a high-low-voltage conversion circuit with high electric field strength. By sealing the outer edge of the conductor layer through the design of the trench, the problem of excessive electric field strength generated due to the outer peripheral edge of the conductor layer on the insulation carrier is solved. Moreover, the occurrence of corona and partial discharge is avoided. The bearing structure is made of an insulation material with a dielectric strength greater than 18 kV/mm. When a high-voltage circuit and a low-voltage circuit with a voltage difference ranged from 10 kV to 30 kV are isolated through the bearing structure, the outer peripheral edge of the conductor layer is sealed by the trench and the insulation material. In that, a distance is maintained between the outer peripheral edge of the conductor layer and an outer surface of the insulation material and greater than 0.6 mm. An air electric field strength on the outer surface of the insulation material is reduced and less than 2.0 kV/mm. It avoids the occurrence of corona and partial discharge due to the contact of the air and the outer peripheral edge of the conductor layer under the high electric field strength. In addition, when the trench and the insulation material are disposed on a peripheral wall formed by the protruding portion, it allows the bearing structure to form an upper half shell or a lower half shell. For example, two bearing structures are utilized to form two symmetrical half shells and assembled as a bearing housing. The high-voltage circuit is sandwiched between the two symmetrical half shells, and the low-voltage circuit is placed outside the bearing housing, so as to achieve a unit assembly of the power conversion module with small volume. It facilitates to ensure the safety of the solid-state transformer application and enhance the competitiveness of the product. On the other hand, the bearing structure having the outer peripheral edge of the conductor layer sealed through the designed trench is allowed to be applied to the bearing housing, which are detached into two symmetrical half shells. The insulation material is filled into the trench by fluid dispensing, which is easily integrated into the manufacturing process of the two symmetrical half shells carrying the power conversion module. The entire space is not increased. Thus, the safety specifications and the convenience of the bearing housing for the power conversion module are improved effectively.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bearing structure configured to carry a high-low-voltage conversion circuit, and comprising:
    an insulation carrier comprising a first surface and a second surface opposite to each other;
    a first conductor layer and a second conductor layer coated on the first surface and the second surface, respectively, wherein a voltage difference is formed between the first conductor layer and the second conductor layer;
a first trench disposed on the first surface and surrounding an outer peripheral edge of the first conductor layer, wherein the first conductor layer is extended from the first surface into the first trench, and the outer peripheral edge of the first conductor layer is located at a bottom of the first trench; and
a first insulation material covering the outer peripheral edge of the first conductor layer and filled in the first trench.

2. The bearing structure according to claim 1, wherein the high-low-voltage conversion circuit is a power conversion module of a solid-state transformer.

3. The bearing structure according to claim 1, wherein the high-low-voltage conversion circuit comprises a high-voltage circuit and a low-voltage circuit, wherein the high-voltage circuit is disposed on the first surface and spatially corresponding to the first conductor layer, and the low-voltage circuit is disposed on the second surface and spatially corresponding to the first conductor layer, so that the voltage difference is formed between the first conductor layer and the second conductor layer.

4. The bearing structure according to claim 3, wherein a half shell is formed by the bearing structure, and two of the half shells are assembled to form a bearing housing, wherein the high-voltage circuit is accommodated within the bearing housing, and the low-voltage circuit is disposed on an outer side of the bearing housing.

5. The bearing structure according to claim 3, wherein the voltage difference formed between the first conductor layer and the second conductor layer is ranged from 10 kV to 30 kV.

6. The bearing structure according to claim 1, wherein a distance is maintained between the outer peripheral edge of the first conductor layer and an outer surface of the first insulation material and greater than 0.6 mm.

7. The bearing structure according to claim 1, wherein an air electric field strength on an outer surface of the first insulation material is less than 2.0 kV/mm.

8. The bearing structure according to claim 1, wherein the first insulation material is one selected from the group consisting of an epoxy resin, a silicone rubber, a silicone resin and a polyurethane.

9. The bearing structure according to claim 1, wherein the first insulation material has a dielectric strength greater than 18 kV/mm.

10. The bearing structure according to claim 1, wherein the first insulation material is filled into the first trench by fluid dispensing.

11. The bearing structure according to claim 1, further comprising a first protruding portion protruded from the first surface in a direction away the second surface, wherein the first trench is disposed on the first protruding portion, wherein the first conductor layer is disposed on the first surface and a lateral wall and a top surface of the first protruding portion, and extended into the first trench.

12. The bearing structure according to claim 11, wherein an outer surface of the first insulation material and the top surface of the first protruding portion are coplanar.

13. The bearing structure according to claim 1, further comprising:
a second trench disposed on the second surface and surrounding an outer peripheral edge of the second conductor layer, wherein the second conductor layer is extended from the second surface into the second trench, and the outer peripheral edge of the second conductor layer is located at a bottom of the second trench; and
a second insulation material filled in the second trench and covering the outer peripheral edge of the second conductor layer.

14. The bearing structure according to claim 13, wherein a distance is maintained between the outer peripheral edge of the second conductor layer and an outer surface of the second insulation material and greater than 0.6 mm.

15. The bearing structure according to claim 13, wherein an air electric field strength on an outer surface of the second insulation material is less than 2.0 kV/mm.

16. The bearing structure according to claim 13, wherein the second insulation material is one selected from the group consisting of an epoxy resin, a silicone rubber, a silicone resin and a polyurethane.

17. The bearing structure according to claim 13, wherein the second insulation material has a dielectric strength greater than 18 kV/mm.

18. The bearing structure according to claim 13, wherein the second insulation material is filled into the second trench by fluid dispensing.

19. The bearing structure according to claim 13, further comprising a second protruding portion protruded from the second surface in a direction away the first surface, wherein the second trench is disposed on the second protruding portion, wherein the second conductor layer is disposed on the second surface and a lateral wall and a top surface of the second protruding portion, and extended into the second trench.

20. The bearing structure according to claim 19, wherein an outer surface of the second insulation material and the top surface of the second protruding portion are coplanar.

21. The bearing structure according to claim 1, wherein a first recessed region is formed on the first surface covered by the first conductor layer, a second recessed region is formed on the second surface covered by the second conductor layer, and the first recessed region and the second recessed region are spatially corresponding to each other in position, wherein the high-low-voltage conversion circuit comprises an isolation transformer disposed correspondingly in the first recessed region and the second recessed region.

* * * * *